(12) United States Patent
Van Lanen

(10) Patent No.: US 12,181,547 B2
(45) Date of Patent: Dec. 31, 2024

(54) FAST QUENCH PROTECTION FOR LOW COPPER TO SUPERCONDUCTING WIRE COILS

(71) Applicant: KONINKLIJKE PHILIPS N.V., Eindhoven (NL)

(72) Inventor: Ezra Petrus Antonius Van Lanen, Niskayuna, NY (US)

(73) Assignee: Koninklijke Philips N.V., Eindhoven (NL)

(*) Notice: Subject to any disclaimer, the term of this patent is extended or adjusted under 35 U.S.C. 154(b) by 661 days.

(21) Appl. No.: 17/286,196

(22) PCT Filed: Oct. 18, 2019

(86) PCT No.: PCT/EP2019/078401
§ 371 (c)(1),
(2) Date: Apr. 16, 2021

(87) PCT Pub. No.: WO2020/079238
PCT Pub. Date: Apr. 23, 2020

(65) Prior Publication Data
US 2021/0349165 A1 Nov. 11, 2021

Related U.S. Application Data

(60) Provisional application No. 62/747,745, filed on Oct. 19, 2018.

(51) Int. Cl.
*H01F 6/02* (2006.01)
*G01R 33/3815* (2006.01)
(Continued)

(52) U.S. Cl.
CPC ....... *G01R 33/3815* (2013.01); *G01R 33/385* (2013.01); *H01F 6/02* (2013.01); *H01F 6/06* (2013.01)

(58) Field of Classification Search
CPC ..... G01R 33/385; G01R 33/3815; H01F 6/02; H01H 6/00
(Continued)

(56) References Cited

U.S. PATENT DOCUMENTS 3,310,765 A   3/1967  Boom
3,559,128 A   1/1971  Kingston et al.
(Continued)

FOREIGN PATENT DOCUMENTS

EP          0350264 A1    1/1990

OTHER PUBLICATIONS

International Search Report and Written Opinion From PCT/EP2019/078401 Mailed Apr. 23, 2020.

*Primary Examiner* — Alexander Talpalatski

(57) ABSTRACT

A superconducting magnet comprises superconducting magnet windings wound as a solenoid to generate a magnetic field oriented in an axial direction when carrying a superconducting electric current, and a superconducting loop having a long axis crossing the superconducting magnet windings along the axial direction. The superconducting loop is thermally connected with the superconducting magnet windings at crossings of the superconducting magnet windings along the axial direction. The superconducting loop is electrically connected with the superconducting magnet windings to carry the superconducting electric current carried by the superconducting magnet windings. A quench initiated in the superconducting magnet windings is propagated simultaneously along the superconducting magnet windings via the superconducting magnet windings and also along the solenoid axis via the superconducting loop.

21 Claims, 5 Drawing Sheets

(51) Int. Cl.
*G01R 33/385* (2006.01)
*H01F 6/06* (2006.01)

(58) Field of Classification Search
USPC .......................................................... 335/216
See application file for complete search history.

(56) References Cited

U.S. PATENT DOCUMENTS

| | | | | |
|---|---|---|---|---|
| 4,509,030 A * | 4/1985 | Vermilyea | ................ | H01F 6/06 |
| | | | | 505/879 |
| 4,717,437 A * | 1/1988 | Blaugher | ............... | H02K 55/04 |
| | | | | 29/605 |
| 4,812,796 A * | 3/1989 | Ries | ......................... | H01F 6/02 |
| | | | | 335/216 |
| 5,204,650 A * | 4/1993 | Nemoto | ............... | H10N 60/355 |
| | | | | 505/879 |
| 5,227,755 A | 7/1993 | Westphal et al. | | |
| 5,361,055 A * | 11/1994 | Peck | .................... | H10N 60/355 |
| | | | | 335/216 |
| 5,680,086 A * | 10/1997 | Allis | .................. | G01R 33/3873 |
| | | | | 324/318 |
| 5,731,939 A | 3/1998 | Gross et al. | | |
| 5,764,121 A | 6/1998 | Wheatley et al. | | |
| RE36,782 E * | 7/2000 | Brown | ................ | G01R 33/3815 |
| | | | | 335/216 |
| 6,897,749 B2 * | 5/2005 | Jonsson | .................. | H01F 6/006 |
| | | | | 505/879 |
| 8,077,001 B2 * | 12/2011 | Tanaka | ................. | H10N 60/355 |
| | | | | 335/216 |
| 8,914,086 B2 * | 12/2014 | Wu | ........................... | H01F 6/06 |
| | | | | 505/211 |
| 9,240,681 B2 * | 1/2016 | Rajput-Ghoshal | ..... | H02H 7/001 |
| 9,508,477 B2 * | 11/2016 | Wu | .................... | G01R 33/3815 |
| 2009/0040664 A1* | 2/2009 | Higuchi | ............. | G01R 33/3806 |
| | | | | 361/19 |
| 2009/0267716 A1* | 10/2009 | Tanaka | ................. | H10N 60/355 |
| | | | | 335/216 |
| 2011/0069418 A1 | 3/2011 | Huang et al. | | |
| 2013/0033346 A1* | 2/2013 | Wang | ........................ | H01F 6/04 |
| | | | | 335/216 |
| 2013/0065767 A1* | 3/2013 | Schauwecker | ........... | H01F 6/06 |
| | | | | 505/211 |
| 2016/0276083 A1 | 9/2016 | Hutton | | |
| 2017/0186520 A1* | 6/2017 | Frantz | ....................... | H01F 6/06 |

* cited by examiner

FAST QUENCH PROTECTION FOR LOW COPPER TO SUPERCONDUCTING WIRE COILS

CROSS REFERENCE TO RELATED APPLICATIONS

This application is a U.S. national phase application of International Application No. PCT/EP2019/078401, filed on Oct. 18, 2019, which claims benefit of priority from U.S. Provisional Application No. 62/747,745 filed on Oct. 19, 2018, and is incorporated herein by reference.

FIELD

The following relates generally to the superconducting magnet arts, magnetic resonance imaging (MRI) arts, and related arts.

BACKGROUND

MRI superconducting magnets typically comprise a wire made of copper with embedded filaments of a superconducting material such as niobium-titanium (NbTi) or niobium-tin ($Nb_3Sn$), with an insulating coating covering the wire. The copper provides electrical conduction when the wire is above the superconducting temperature threshold; while, below the superconducting temperature threshold the embedded superconductor filaments carry the electrical current. In persistent mode the magnet can generate a magnetic field using electric current circulating in the superconductor fibers without connection to an electric current source.

Quench occurs if the superconductor filaments are carrying a superconducting current, but then are heated to a temperature that is above the critical temperature for superconductivity at the extant electric current and magnetic field level. Upon quench, the copper conductor takes over as the electrical conductor-however, this leads to resistive Joule heating which produces heat dissipation power proportional to $I^2R$ where I is the electric current and R is the resistance of the copper conductor. The Joule heating, in turn, can damage the coil windings and/or their surroundings. The likelihood of quench damage can be reduced if the amount of copper in the wire is high compared with the amount of superconductor. This is typically quantified by the copper-to-superconductor ratio, i.e. the Cu: SC, ratio. However, a high Cu: SC ratio leads to higher material cost. Using wire with low Cu: SC ratio is more cost effective, but raises the likelihood of damage during unanticipated quench.

MRI superconducting magnets operating at cryogenic temperature may require training after production to reach their field. As the coils and their superconducting wire settle under the influence of increasing Lorentz force, the energy release due to for instance stick slip motion of the coils may locally drive the coil out of superconducting state. This normal zone then propagates as more power is dissipated in the metallic (non-superconducting) matrix due to the magnet's operating current. Ultimately the whole coil will return to normal state, and as a result the magnet current returns to zero. This process is known as a quench, and the heat dissipation in the normal zone can damage a magnet.

The following discloses certain improvements.

SUMMARY

In some non-limiting illustrative embodiments disclosed herein, a superconducting magnet comprises superconducting magnet windings wound as a solenoid to generate a magnetic field oriented in an axial direction when carrying a superconducting electric current, and a superconducting loop having a long axis crossing the superconducting magnet windings along the axial direction. The superconducting loop is thermally connected with the superconducting magnet windings at crossings of the superconducting magnet windings along the axial direction. The superconducting loop is electrically connected with the superconducting magnet windings to carry the superconducting electric current carried by the superconducting magnet windings. The superconducting loop may be thermally connected with the superconducting magnet windings at the crossings of the superconducting magnet windings along the axial direction by epoxy covering the superconducting magnet windings and the superconducting loop. The superconducting loop may include: at least one outside superconducting loop disposed outside the solenoid on an outside surface of the superconducting magnet windings; and/or at least one inside superconducting loop disposed inside the solenoid on an inside surface the superconducting magnet windings.

In some non-limiting illustrative embodiments disclosed herein, a superconducting magnet comprises superconducting magnet windings wound as a solenoid defining a solenoid axis, and a superconducting loop having a long axis parallel with the solenoid axis. The superconducting loop is disposed on the superconducting magnet windings. The superconducting loop is electrically connected in series with the superconducting magnet windings. In some embodiments, the superconducting magnet windings and the superconducting loop are coated with epoxy connecting the superconducting loop and the superconducting magnet windings. the superconducting loop may include at least one outside superconducting loop disposed outside the solenoid on an outside surface of the superconducting magnet windings, and/or at least one inside superconducting loop disposed inside the solenoid on an inside surface of the superconducting magnet windings. In some embodiments, the superconducting magnet windings are made of superconducting wire and the superconducting loop is made of superconducting wire of a same type as the superconducting magnet windings.

In some non-limiting illustrative embodiments disclosed herein, a magnetic resonance imaging (MRI) system comprises a superconducting magnet as set forth in one of the two immediately preceding paragraphs, and magnetic field gradient coils configured to superimpose magnetic field gradients on a magnetic field generated by the superconducting magnet windings.

In some non-limiting illustrative embodiments disclosed herein, a quench method comprises: conducting a superconducting electric current in superconducting magnet windings wound as a solenoid defining a solenoid axis and also in a superconducting loop extending across the superconducting magnet windings; and propagating a quench initiated in the superconducting magnet windings simultaneously along the superconducting magnet windings via the superconducting magnet windings and also along the solenoid axis via the superconducting loop. The propagating suitably includes transferring heat between the superconducting magnet windings and the superconducting loop at crossings of the superconducting loop and windings of the superconducting magnet windings.

One advantage resides in providing a superconducting magnet exhibiting a more spatially distributed quench.

Another advantage resides in providing a superconducting magnet with reduced likelihood of quench damage.

Another advantage resides in providing a superconducting magnet with lower Cu: SC ratio without concomitant increase in likelihood of quench damage.

Another advantage resides in providing a superconducting magnet with one or more of the foregoing advantages further having reduced manufacturing cost.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION

As the magnet current exits the superconducting filaments and into the surrounding copper during quench, the Joule heating in the resistive copper propels the propagation of the normal zone (i.e., propels the quench) much faster than thermal conduction alone would achieve. At the same time, heat conduction between turns and layers of the superconducting magnet windings further accelerates the quench propagation. For magnets with an axial to radial ratio that is not too far away from one, the total normalized (non-superconducting) volume grows roughly with time to the third power. However, for magnet designs with a very high axial to radial ratio, the quench propagation in the axial direction is negligible, and the normal volume increases only linearly with time. In such a case, quench protection systems may not be fast enough to prevent damage to the superconducting magnet.

Figure 1:
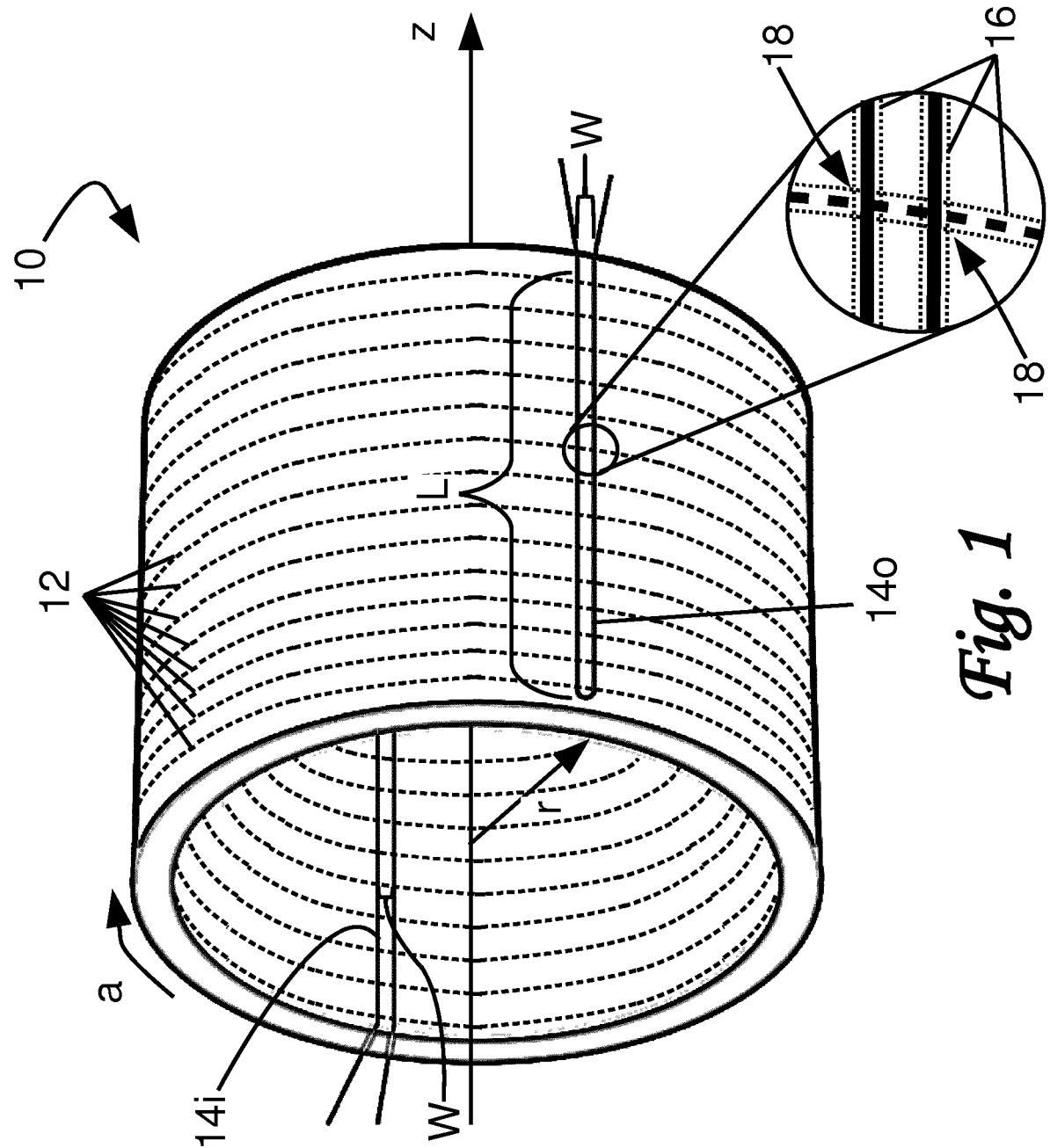
FIG. 1 diagrammatically illustrates a superconducting magnet comprising superconducting magnet windings wound as a solenoid and a superconducting loop having a long axis parallel with the solenoid axis. The inset shows a crossing of the superconducting loop and a winding of the superconducting magnet windings.
Figure 2:
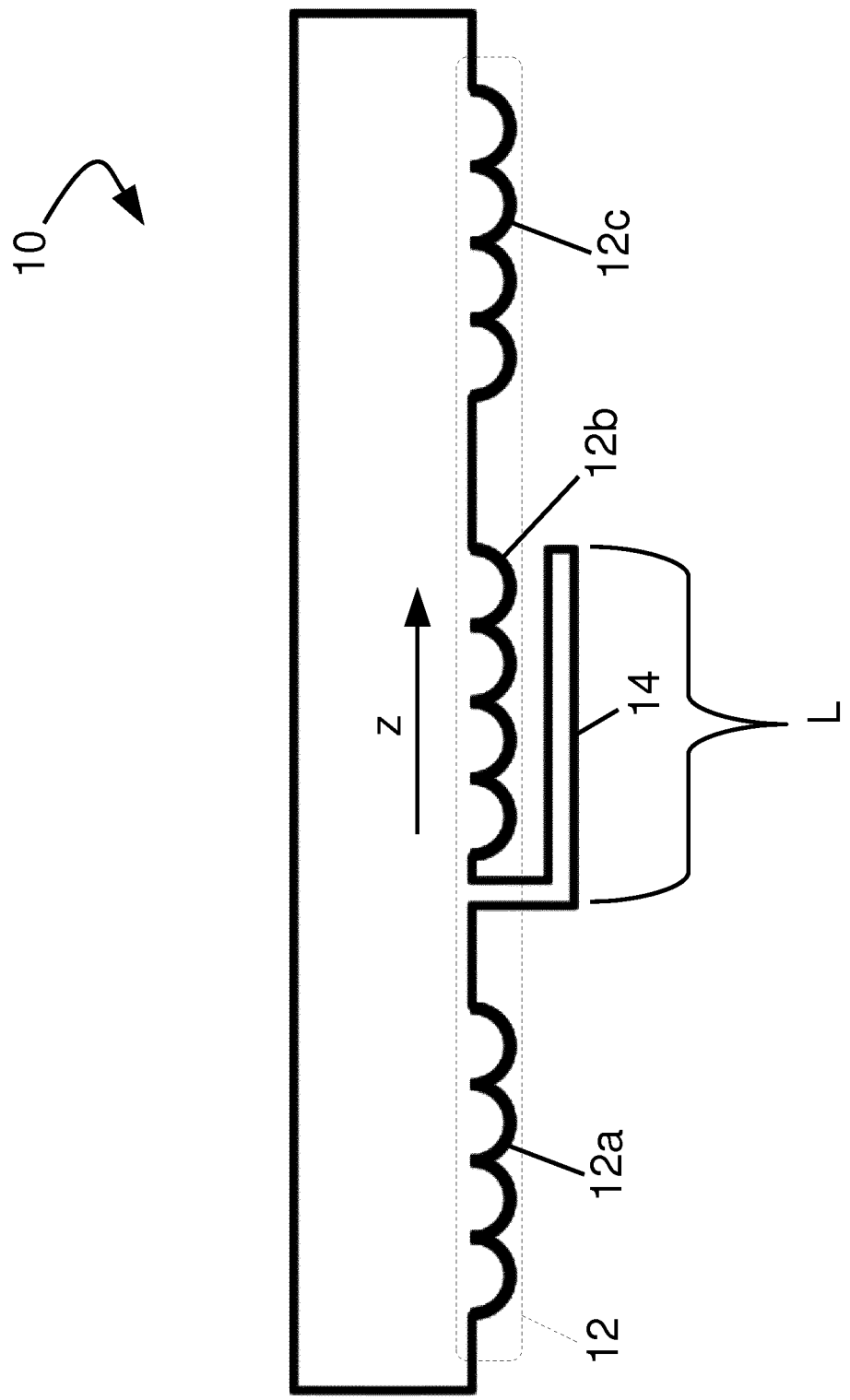
FIG. 2 diagrammatically illustrates an electrical schematic of the superconducting magnet windings and the superconducting loop of the superconducting magnet of FIG. 1.

Disclosed herein are improved superconducting magnets which provide more rapid quench propagation in the axial direction, in some cases providing quench propagation in the axial direction that is nearly as fast as quench propagation in azimuthal direction With reference to FIGS. 1 and 2, an illustrative superconducting magnet 10 is shown. FIG. 1 shows an illustrative diagrammatic perspective view of the superconducting magnet 10, while FIG. 2 shows an illustrative diagrammatic electrical schematic of the superconducting magnet 10. The superconducting magnet 10 includes superconducting magnet windings 12 which are wound as a solenoid to generate a magnetic field oriented in an axial direction (z), also denoted herein as the z-axis, when carrying a superconducting electric current. Put another way, the superconducting magnet windings 12 are wound as a solenoid defining a solenoid axis (z). The solenoid defined by the superconducting magnet windings is generally cylindrical with the cylinder axis coinciding with the axial direction (z), that is, coinciding with the solenoid axis (z), and an illustrative cylindrical coordinate system is indicated in FIG. 1 including the z-axis, a radial axis indicated as direction arrow (r), and an azimuthal direction indicated in FIG. 1 by a curved arrow (a). The superconducting magnet windings generally follow an azimuthal winding path spiraling around the solenoid azis (z). Moreover, while FIG. 1 diagrammatically shows the superconducting magnet windings 12 as a single layer of coil windings all at the indicated radius (r), more generally the superconducting magnet windings 12 may be wound as one, two, three, or more layers at different radial positions (e.g. radial position of each layer differing from the adjacent layer by the thickness of a single winding layer); and/or may be grouped into one or two or more winding sections (e.g. three winding sections 12a, 12b, 12c which are spaced apart from one another along the z-axis as diagrammatically shown in FIG. 2), and/or may be at differing radial positions (for example, in one design employing the three winding sections 12a, 12b, 12c, the central winding section 12b may be at a different radius (r) compared with the outer winding sections 12a, 12b, and further variations such as employing a taper in which the radial position changes along the axial direction is also contemplated, among other variants. In general, the superconducting magnet windings 12 form a continuous spiral current path defining the solenoid; in the case of multiple winding sections such as the three winding sections 12a, 12b, 12c of illustrative FIG. 2, the winding sections 12a, 12b, 12c are typically electrically connected in series.

With continuing reference to FIGS. 1 and 2, the superconducting magnet 10 further includes a superconducting loop 14 having a long axis (L) crossing the superconducting magnet windings 12 along the axial direction (z). The superconducting loop 14 has its long axis (L) parallel with the solenoid axis. The superconducting loop 14 is thermally connected with the superconducting magnet windings 12 at the crossings of the superconducting magnet windings 12 along the axial direction (z), for example (as shown in the inset of FIG. 1) by epoxy 16 covering the superconducting magnet windings 12 and the superconducting loop 14.

The superconducting loop 14 is thermally connected with the superconducting magnet windings 12 at the crossings of the superconducting magnet windings along the axial direction (z). With reference to the inset of FIG. 1, at crossings 18 of the superconducting magnet windings 12, the epoxy 16 coating the superconducting loop 14 and the crossed superconducting magnet winding 12 provides a bond securing the superconducting loop 14 and the crossed superconducting magnet winding 12 at the crossing 18, providing close proximity between the superconducting magnet winding 12 and superconducting loop 14 across which heat can transfer conductively through the epoxy 16, and/or by radiative heat transfer. The thermal connection may be achieved in other ways besides bonding via epoxy 16 of the superconducting loop 14 and the crossed superconducting magnet winding 12 at the crossings 18, such as by providing dedicated thermally conductive contacts at these crossings. However, the crossings 18 of the superconducting loop 14 and the crossed superconducting magnet windings 12 should not be electrically conductive—the purpose is to transfer Joule heating between the superconducting magnet windings 12 and the superconducting loop 14, but not to short-circuit the superconducting magnet winding 12 by the superconducting loop 14.

The superconducting loop may be disposed outside of the solenoid on an outside surface of the superconducting magnet windings 12, as in the illustrative case of the superconducting loop 140 of FIG. 1. Alternatively, superconducting loop may be disposed inside the solenoid on an inside surface of the superconducting magnet windings 12, as in the illustrative case of the superconducting loop 14*i* of FIG. 1. As each superconducting loop 14 provides a path for propagation of quench along the axial (z) direction, it follows that providing more than one superconducting loop (for example, providing both outer and inner superconducting loops 140, 14*i* as in illustrative FIG. 1) provides further enhancement of axial propagation of the quench. Moreover, although not illustrated, such superconducting loops may be provided (on the outside and/or inside of the solenoid) at multiple angular positions around the solenoid, e.g. six superconducting loops may be provided at 60 degree intervals around the solenoid to promote quench propagation in the axial direction around the circumference of the superconducting magnet 10. If the superconducting magnet winding 12 are arranged into spaced apart winding sections, e.g. winding sections 12*a*, 12*b*, 12*c* in illustrative FIG. 2, then the superconducting loop 14 may extend axially along one section, as the illustrative superconducting loop 14 extends axially along the winding section 12*b* in illustrative FIG. 2. Although not shown in FIG. 2, it will be appreciated that analogous superconducting loops may be provided which extend along the winding section 12*a* and along the winding section 12*c*, respectively. In an alternative embodiment, a single superconducting loop may encompass all three winding sections 12*a*, 12*b*, 12*c* (variant not shown).

As labeled in FIG. 1, each superconducting loop 140, 14*i* has a long axis (L) extending along the axial direction, and also has a short axis or width (W) extending transverse to the axial direction. As the purpose of the superconducting loops 14 is to promote propagation of the quench (and, more generally, to promote propagation of the Joule heating associated with the quench) along the axial direction, it is generally preferable for the long axis (L) along the axial direction to be substantially larger than the short axis or width (W) in the transverse direction. For example, in some embodiments the superconducting loop 14 has an aspect ratio (that is, L/W ratio) of at least 5:1, although smaller or larger (and even substantially larger, e.g. 50:1 or higher) L/W aspect ratios are contemplated. Indeed, it is contemplated in some embodiments for the two lengthwise wires running along the long axis (L) to be touching, that is, to have the insulation of the two lengthwise wires making up the long axis (L) sides be in physical contact. By keeping the L/W aspect ratio large, the amount of superconducting wire (equal to 2L+W) is minimized for a given axial length L, and additionally the area encompassed by the superconducting loop 14 (equal to L×W) is also minimized. Keeping the area L×W small reduces the amount of stray magnetic field generated by the superconducting loop 14. Indeed, it will be appreciated that the current flowing in the two neighboring long legs extending along the long axis L are in opposing directions, so that if the width W is small then the magnetic fields generated by these two currents will mostly cancel each other out.

As previously noted, the crossings 18 of the superconducting loop 14 and the crossed superconducting magnet windings 12 should not be electrically conductive. In other words, the superconducting loop 14 should be isolated from galvanic contact with the crossed superconducting magnet windings 12 at the crossings 18. On the other hand, as shown in FIG. 2, each superconducting loop 14 is electrically connected with the superconducting magnet windings 12 at its end in order to carry the superconducting electric current carried by the superconducting magnet windings 12. This current ensures the desired quench propagation speed in the loop. In FIG. 2, the superconducting loop 14 is electrically connected in series with the superconducting magnet winding sections 12*a*, 12*b*, 12*c* (these winding sections are themselves connected in series). (Note that in FIG. 1 the electrical connections of the ends of the superconducting loops 140, 14*i* with the superconducting magnet windings 12 are not illustrated).

The superconducting magnet windings 12 are made of superconducting wire. For example, the superconducting wire may be made of copper with embedded filaments of a superconducting material such as niobium-titanium (NbTi) or niobium-tin ($Nb_3Sn$), a medium temperature superconductor such as $MgB_2$, or of a high temperature superconductor such as ReBCO, with an insulating coating covering the wire. The superconducting loop 14 is also made of superconducting wire, and is typically made of superconducting wire of a same type as the superconducting magnet windings 12, which is convenient from a manufacturing standpoint as in this case the superconducting magnet windings 12 and the one or (typically more) superconducting loops 14 can be continuously unwound off a single spool of superconducting wire without the need to make any superconducting joint connections or the like. In some embodiments, the superconducting magnet windings 12 (and also the superconducting loop 14, typically) are made of superconducting wire comprising copper with embedded filaments of a superconductor in which the superconducting wire has a low copper-to-superconductor ratio (Cu:SC ratio), for example a Cu: SC ratio of 4 or less. It will be appreciated that such low copper-to-superconductor wire is particularly susceptible to damage during an unanticipated quench due to high Joule heating that can be expected due to the low copper content of the wire.

Figure 3:
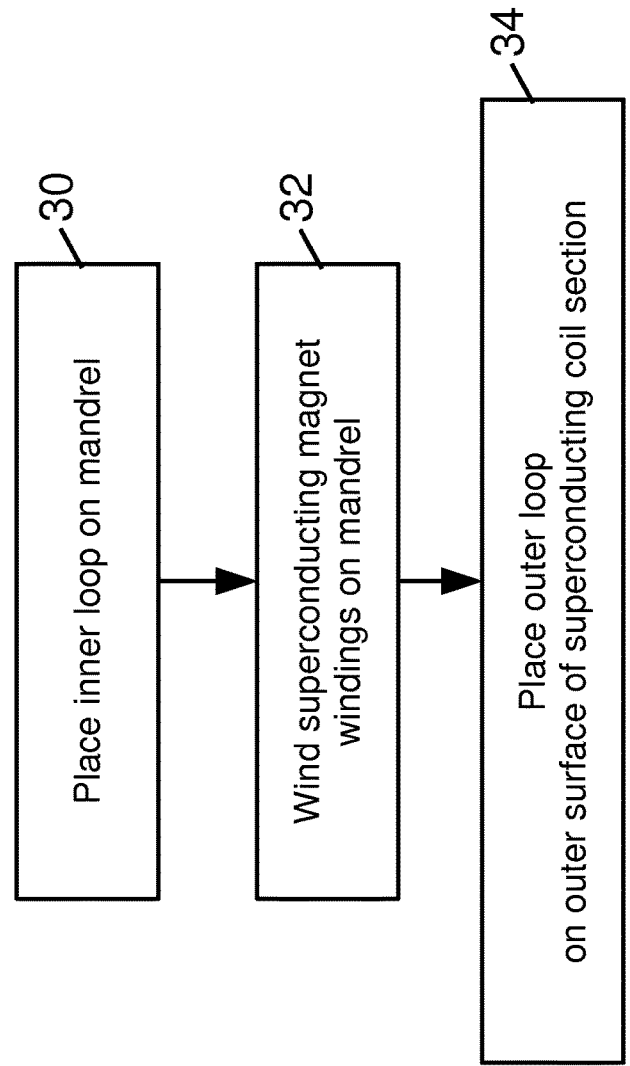
FIG. 3 diagrammatically illustrates a method of manufacturing the superconducting magnet of FIGS. 1 and 2.

With reference now to FIG. 3, a suitable method of manufacturing the superconducting magnet 10 is shown by way of a flowchart. The winding process suitably employs a cylindrical former or mandrel (not shown), and the operations 30, 32, 34 are suitably performed using a continuous wire payout from a spool (not shown) of superconducting wire, with epoxy 16 being coated onto the wire as it is drawn off the spool. In an operation 30, the one or more inner superconducting loops 14*i*, if employed, are laid down on the former or mandrel. Thereafter, in an operation 32 the superconducting magnet windings 12 are wound onto the former or mandrel. This automatically will place the superconducting magnet windings 12 on top of the one or more inner superconducting loops 14*i* (if employed) so that the inner loop(s) 14*i* are disposed inside the solenoid on the inside surface the superconducting magnet windings. In an operation 34, the one or more outer superconducting loops 140, if employed, are placed on top of the superconducting magnet windings 12. Although not shown in FIG. 3, various finishing operations may be performed, such as a curing step to cure the epoxy 16, a wrapping step to place an optional covering layer or material over the superconducting magnet windings 12 and the superconducting loop(s) 14, removal of the mandrel (if a former is used then it may be retained as structural support for the magnet), and/or so forth.

Figure 4:
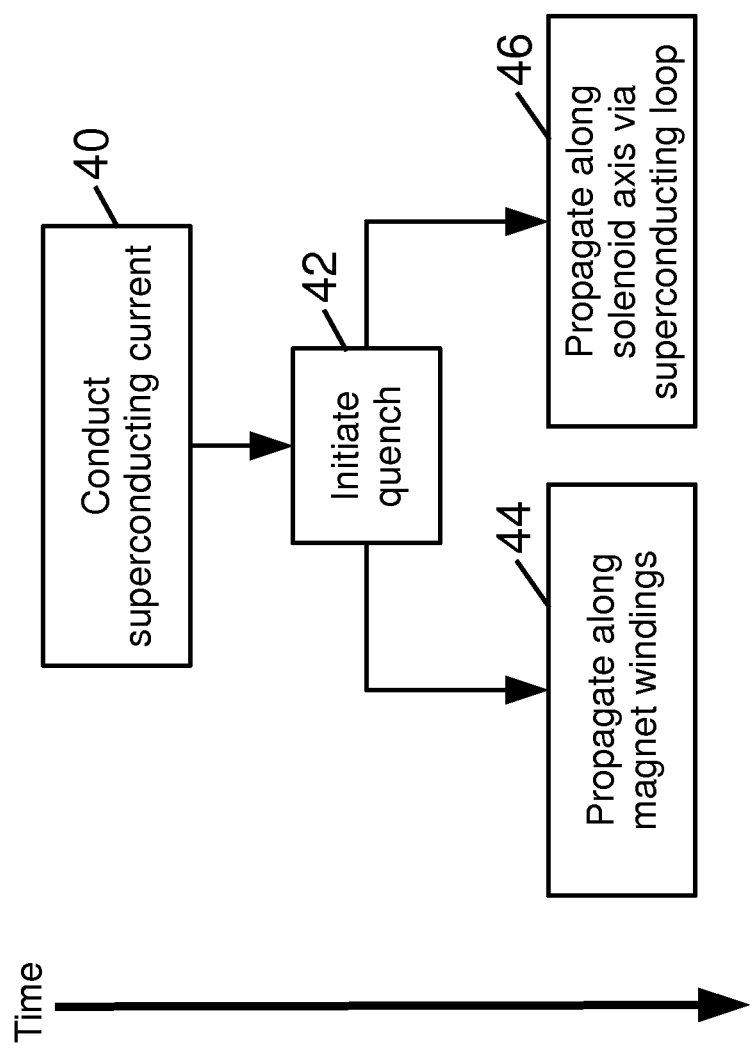
FIG. 4 diagrammatically illustrates a quench method suitably performed in conjunction with the superconducting magnet of FIGS. 1 and 2.

With reference now to FIG. 4, operation of the superconducting magnet 10 including response to a quench is described by way of a flowchart. In an operation 40, during normal operation superconducting electric current is conducted in the superconducting magnet windings 12 which are wound as a solenoid defining a solenoid axis, and the superconducting electric current is also carried by the superconducting loop(s) 14 extending across the superconducting magnet windings 12. The normal operating state of operation 40 is suitably achieved using an approach for establishing a persistent superconducting current in superconducting magnet windings. In one possible startup sequence, the superconducting magnet 10 is cooled down to a temperature below the superconducting transition temperature for the superconductor of the superconducting wire (e.g. using helium cooling to chill to around 4K), followed by ramping the electric current via removable current leads, or permanently installed high temperature superconductor leads, closing a persistent switch and removing the leads after which a persistent superconducting current flows through the superconducting magnet windings 12 and connected superconducting loop(s) 14.

In an operation 42, a quench is initiated at some initial quench location in the superconducting magnet windings 12. This can occur in various ways, and may in some instances be an unanticipated quench caused by localized heating, malfunction of the cryogenic cooling system, energy release due to stick slip motion or other motion of the coils caused by Lorentz forces that locally drives the coil out of superconducting state, and/or so forth.

In simultaneous operations 44, 46, the quench propagates spatially throughout the superconducting magnet 10, principally due to Joule heating of the copper. Specifically, as indicated by operation 44 the quench propagates in the azimuthal direction along the direction of the wrapped superconducting magnet windings 12. This propagation is fast because there is a continuous copper path along the superconducting magnet windings 12. In a conventional magnet, the quench propagation along the axial direction would be much slower because there is no continuous copper path oriented along the axial direction. However, In the superconducting magnet 10 one or more such paths are provided by way of the superconducting loop(s) 14. Hence, in the operation 46 which occurs simultaneously with the operation 44, the quench propagates along the solenoid axis (that is, along the axial or z direction) via the superconducting loop(s) 14. These superconducting loop(s) 14 provide continuous copper path(s) for propagating the Joule heating and hence the quench, and heat transfer from the superconducting loop(s) 14 from one winding to the next occurs via the crossings 18 (see FIG. 1 inset). As a consequence, the superconducting magnet 10 has more uniform and rapid spread of the quench, particularly in the axial (z) direction due to the superconducting loop(s) 14 extending in the axial direction across the superconducting magnet windings 12.

The disclosed quench protection system employs the superconducting loop(s) 14 looped in the axial (z) direction, and mounted against either the inner or outer surface of the superconducting magnet windings 12, as illustrated in FIG. 1. The wire used for the superconducting loop(s) 14 can be the same wire as used for the superconducting magnet windings 12, which has manufacturing advantages. Alternatively, the superconducting loop(s) 14 can be dedicated superconducting wire, which may be of a different type than the wire used to wind the superconducting magnet windings 12 (e.g. different Cu: SC ratio, different superconductor material, or so forth), which can allow for the properties of the superconducting wire of the loop(s) 14 to be optimized depending on the design parameters for the quench propagation and other design or manufacturing considerations. Similar considerations may lead to the decision to put more than one of such superconducting loops 14 around the periphery of the coil. The superconducting loop(s) 14 are connected in series with the main circuit of the superconducting magnet windings 12, and will thus carry the same electric current as in the superconducting magnet windings 12, as seen in FIG. 2. If the same type of superconducting wire is used for both the superconducting magnet windings 12 and the superconducting loop(s) 14, then the entire circuit can be unwound from a spool of superconducting wire without needing to join them electrically later in the process, which can save considerable time in manufacturing.

When a quench initiates at any location inside the superconducting magnet 10, the normal zone will reach the superconducting loop(s) 14 with the speed of its azimuthal propagation along the superconducting magnet windings 12. Since the superconducting loop(s) 14 are carrying the same electric current as the superconducting magnet windings 12, the loop(s) 14 will quench as well, and the normal zone in the superconducting loop(s) 14 will propagate along the axial (z) direction of the superconducting magnet 10. As a result, the normalized (warm) wire will quench the other turns of the superconducting magnet windings 12 with almost the speed of azimuthal quench propagation, which will keep the peak temperature under control.

Advantageously, the effect of the superconducting loop(s) 14 on the uniformity of the magnetic field generated by the superconducting magnet 10 is minimal, because the superconducting loop 14 encloses a very small area. Similarly to the case of a bifilar winding, the magnetic fields generated by the electric current in the superconducting loop 14 mostly cancel out. Moreover, the superconducting loop(s) 14 do not generate a magnetic field component in the axial direction of the superconducting magnet 10.

The disclosed approach may be used for coils with typically low temperature superconductors (below 5 Kelvin), but also may be used on superconducting magnets with superconductors that operate at a higher temperature (above 15 Kelvin). The normal zone propagation is slower at higher temperatures, which may be compensated by selecting appropriate superconducting wire for this case.

The illustrative superconducting magnet 10 including one or more axially extending superconducting loops 14 may be used in any application that benefits from a superconducting magnet with more uniform quench propagation. One particular application is in a magnetic resonance imaging (MRI) system.

Figure 5:
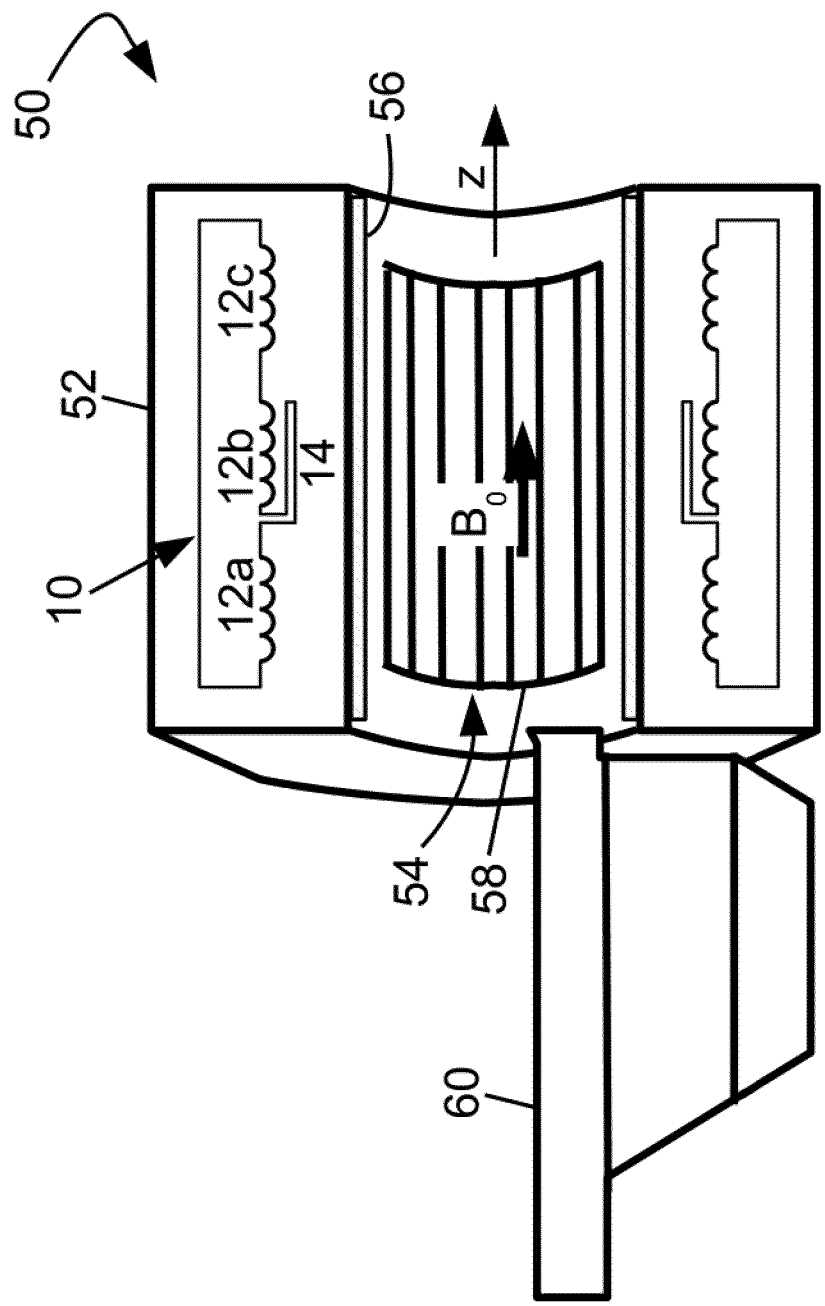
FIG. 5 diagrammatically illustrates a magnetic resonance imaging (MRI) system including the superconducting magnet of FIGS. 1 and 2.

With reference to FIG. 5, an illustrative MRI system 50 employing the superconducting magnet 10 of FIGS. 1 and 2 is diagrammatically shown. The superconducting magnet 10 is housed in a cryostat 52 which forms (at least a portion of) a housing of the MRI system 50. The cryostat 52 is not shown in detail, but may for example comprise a cylindrical vacuum-jacketed liquid helium dewar within which the superconducting magnet 10 is mounted. The cryostat 52 may be a conventional design in which liquid helium feed/vent lines are provided for charging the dewar with liquid helium during setup and occasionally thereafter replenishing the helium as part of routine maintenance of the MRI system 50. Alternatively, the cryostat 52 may comprise a permanently sealed dewar with a charge of liquid helium that is not designed to be replenished as part of routine maintenance of the MRI system 50. The superconducting magnet 10 generates a static ($B_0$) magnetic field in a bore 54 of the MRI system 50. The bore 54 is suitably the cylindrical central opening of the sealed cylindrical cryostat 52, although other designs are contemplated. The MRI system 50 further includes magnetic field gradient coils 56 configured to superimpose magnetic field gradients on the ($B_0$) magnetic field generated by the superconducting magnet winding sections 12a, 12b, 12c of the superconducting magnet 10 of the MRI system 50. In one suitable embodiment, the magnetic field gradient coils 56 include three gradient coil sets: an x-gradient coil wound to superimpose magnetic field gradients in an x-direction which is transverse to the axial (z) direction; a y-gradient coil wound to superimpose magnetic field gradients in a y-direction which is transverse to the axial (z) direction and is also transverse to the x-direction; and a z-gradient coil wound to superimpose magnetic field gradients in the axial (z) direction. The magnetic field gradient coils 56 are typically resistive copper coils, and may use any conventional winding arrangement for generating the respective transverse (x, y) and longitudinal (z) magnetic field gradients. The magnetic field gradient coils 56 are used for various known purposes such as superimposing slice-selective magnetic field gradients during excitation of nuclear magnetic resonance (NMR), superimposing phase encoding magnetic field gradients after excitation of NMR, superimposing frequency encoding magnetic field gradients during readout of the NMR signal (the phase and frequency encoding operates to spatially encode the NMR signals enabling spatial reconstruction of a magnetic resonance image), applying magnetic field gradients to prepare a resonance state, to spoil NMR, and/or so forth. The MRI system 50 may optionally further include a whole-body radio frequency (RF) coil 58 for exciting and/or reading the NMR; additionally or alternatively, local RF coils (not shown) may be used for NMR excitation and/or readout. A patient loading system 60 typically including a patient support pallet, couch, or the like and associated robotic actuators for moving the patient into/out of the bore 54 is commonly also provided for MRI systems used in medical imaging. The MRI system 50 may include numerous other features known in the art but not described here.

The invention has been described with reference to the preferred embodiments. Modifications and alterations may occur to others upon reading and understanding the preceding detailed description. It is intended that the exemplary embodiment be construed as including all such modifications and alterations insofar as they come within the scope of the appended claims or the equivalents thereof.

The invention claimed is:

1. A superconducting magnet comprising:
   superconducting magnet windings wound as a solenoid to generate a magnetic field oriented in an axial direction (z) when carrying a superconducting electric current; and
   a superconducting loop oriented perpendicularly to the superconducting magnet windings and having a long axis (L) crossing the superconducting magnet windings along the axial direction;
   wherein the superconducting loop is thermally connected with the superconducting magnet windings at crossings of the superconducting magnet windings along the axial direction, and the crossings of the superconducting loop and the crossed superconducting magnet windings are not electrically conducting; and
   wherein the superconducting loop is electrically connected with the superconducting magnet windings to carry the superconducting electric current carried by the superconducting magnet windings.

2. The superconducting magnet of claim 1 wherein the superconducting loop is thermally connected with the superconducting magnet windings at the crossings of the superconducting magnet windings along the axial direction by epoxy covering the superconducting magnet windings and the superconducting loop.

3. The superconducting magnet of claim 1 wherein the superconducting loop has two lengthwise wires extending along the long axis (L) that are touching.

4. The superconducting magnet of claim 1 wherein the superconducting loop is disposed outside of the solenoid on an outside surface of the superconducting magnet windings.

5. The superconducting magnet of claim 1 wherein the superconducting loop is disposed inside the solenoid on an inside surface of the superconducting magnet windings.

6. The superconducting magnet of claim 1 wherein the superconducting loop includes:
   an outside superconducting loop disposed outside the solenoid on an outside surface of the superconducting magnet windings; and
   an inside superconducting loop disposed inside the solenoid on an inside surface the superconducting magnet windings.

7. The superconducting magnet of claim 1 wherein:
   the superconducting magnet windings are made of superconducting wire; and
   the superconducting loop is made of superconducting wire of a same type as the superconducting magnet windings.

8. The superconducting magnet of claim 1 wherein the superconducting magnet windings are made of superconducting wire comprising copper and superconductor with a copper-to-superconductor ratio of 4 or less.

9. A superconducting magnet comprising:
   superconducting magnet windings wound as a solenoid defining a solenoid axis (z); and
   a superconducting loop oriented perpendicularly to the superconducting magnet windings and having a long axis (L) parallel with the solenoid axis;
   wherein the superconducting loop is disposed on the superconducting magnet windings; and
   wherein the superconducting loop is electrically connected in series with the superconducting magnet windings.

10. The superconducting magnet of claim 9 wherein the superconducting magnet windings and the superconducting loop are coated with epoxy connecting the superconducting loop and the superconducting magnet windings.

11. The superconducting magnet of claim 9 wherein the superconducting loop has two lengthwise wires extending along the long axis (L) that are touching.

12. The superconducting magnet of claim 9 wherein the superconducting loop is disposed outside the solenoid on an outside surface of the superconducting magnet windings.

13. The superconducting magnet of claim 9 wherein the superconducting loop is disposed inside the solenoid on an inside surface of the superconducting magnet windings.

14. The superconducting magnet of claim 9 wherein the superconducting loop includes:
   an outside superconducting loop disposed outside the solenoid on an outside surface of the superconducting magnet windings; and
   an inside superconducting loop disposed inside the solenoid on an inside surface of the superconducting magnet windings.

15. The superconducting magnet of claim 9 wherein:
the superconducting magnet windings are made of superconducting wire; and
the superconducting loop is made of superconducting wire of a same type as the superconducting magnet windings.

16. The superconducting magnet of claim 9 wherein the superconducting magnet windings are made of superconducting wire comprising copper and superconductor wherein the superconducting wire has a copper-to-superconductor ratio of 4 or less.

17. A magnetic resonance imaging (MRI) system comprising:
the superconducting magnet as set forth in claim 1; and
magnetic field gradient coils configured to superimpose magnetic field gradients on a magnetic field ($B_0$) generated by the superconducting magnet windings.

18. The superconducting magnet of claim 1, wherein the superconducting loop has an aspect ratio of the long axis length (L) to a width (W) in a range of 5:1 to 50:1.

19. The superconducting magnet of claim 9, wherein the superconducting loop has an aspect ratio of the long axis length (L) to a width (W) in a range of 5:1 to 50:1.

20. The superconducting magnet of claim 6, wherein the outside superconducting loop and the inside superconducting loop are each single loops.

21. The superconducting magnet of claim 14, wherein the outside superconducting loop and the inside superconducting loop are each single loops.

* * * * *